(12) United States Patent
Sakane (10) Patent No.: US 12,347,658 B2
(45) Date of Patent: Jul. 1, 2025

(54) STAGE AND PLASMA PROCESSING APPARATUS

(71) Applicant: Tokyo Electron Limited, Tokyo (JP)

(72) Inventor: Ryota Sakane, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 88 days.

(21) Appl. No.: 17/386,663

(22) Filed: Jul. 28, 2021

(65) Prior Publication Data

US 2022/0037131 A1    Feb. 3, 2022

(30) Foreign Application Priority Data

Jul. 31, 2020    (JP) ................. 2020-130989

(51) Int. Cl.
*H01J 37/32*    (2006.01)
*H01L 21/683*    (2006.01)
*H01L 21/687*    (2006.01)

(52) U.S. Cl.
CPC .. *H01J 37/32724* (2013.01); *H01J 37/32715* (2013.01); *H01L 21/6833* (2013.01); *H01L 21/68735* (2013.01); *H01J 2237/002* (2013.01); *H01J 2237/2007* (2013.01)

(58) Field of Classification Search
None
See application file for complete search history.

(56) References Cited

U.S. PATENT DOCUMENTS

| 5,636,098 | A | * | 6/1997 | Salfelder | ............ | H01L 21/6833 |
| | | | | | | 361/234 |
| 5,870,271 | A | * | 2/1999 | Herchen | ................ | H02N 13/00 |
| | | | | | | 361/234 |
| 2014/0291311 | A1 | * | 10/2014 | Cho | .................. | H01L 21/67103 |
| | | | | | | 29/611 |
| 2015/0024517 | A1 | * | 1/2015 | Shriner | ............. | H01L 21/67069 |
| | | | | | | 156/345.52 |
| 2018/0190501 | A1 | * | 7/2018 | Ueda | .................. | H01L 21/67069 |
| 2018/0204757 | A1 | * | 7/2018 | Fushimi | ............ | H01J 37/32174 |
| 2019/0164726 | A1 | * | 5/2019 | Tamamushi | ...... | H01J 37/32495 |
| 2021/0210369 | A1 | * | 7/2021 | Sugawa | ............ | H01L 21/68735 |

FOREIGN PATENT DOCUMENTS

| CN | 107039326 A | 8/2017 | |
| DE | 202018106098 U1 | * 12/2018 | ....... H01L 21/67069 |
| JP | 2016-27601 A | 2/2016 | |
| JP | 2018-110216 A | 7/2018 | |

OTHER PUBLICATIONS

English Machine Translation of Chang (DE 202018106098 U1) retrieved from PE2E-SEARCH (Year: 2023).*

* cited by examiner

*Primary Examiner* — Ram N Kackar
*Assistant Examiner* — Laureen Chan
(74) *Attorney, Agent, or Firm* — Jerald L. Meyer; Tanya E. Harkins (57) ABSTRACT

A stage for mounting a substrate thereon, includes: an electrostatic chuck configured to attract the substrate; a base having a first region on which the electrostatic chuck is supported and a second region on which an edge ring arranged around the substrate is supported, the first region and the second region being divided by a groove extending in an annular shape; and a shield provided in the groove and configured to thermally separate the first region and the second region.

5 Claims, 5 Drawing Sheets

[Related Art]

STAGE AND PLASMA PROCESSING APPARATUS

CROSS-REFERENCE TO RELATED APPLICATION

This application is based upon and claims the benefit of priority from Japanese Patent Application No. 2020-130989, filed on Jul. 31, 2020, the entire contents of which are incorporated herein by reference.

TECHNICAL FIELD

The present disclosure relates to a stage and a plasma processing apparatus.

BACKGROUND

Patent Document 1 discloses a stage in which a groove is formed between a region on which a substrate is placed and a region on which a focus ring is placed around the substrate to increase a temperature difference.

PRIOR ART DOCUMENT

Patent Document

Patent Document 1: Japanese Laid-Open Patent Publication No. 2016-027601

SUMMARY

According to one embodiment of the present disclosure, there is provided a stage for mounting a substrate thereon, including: an electrostatic chuck configured to attract the substrate; a base having a first region on which the electrostatic chuck is supported and a second region on which an edge ring arranged around the substrate is supported, the first region and the second region being divided by a groove extending in an annular shape; and a shield provided in the groove and configured to thermally separate the first region and the second region.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a stage and a plasma processing apparatus disclosed herein will be described in detail with reference to the drawings. It should be noted that the present embodiments do not limit the stage and the plasma processing apparatus disclosed herein. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the plasma processing apparatus, deposits such as a polymer and the like are deposited on the structures around a substrate. Such deposits are disturbed and are lifted up due to a fluctuation in electric field and become particles, which may cause defects.

In the plasma processing apparatus, a base of a stage is cooled to a low temperature in order to suppress an excessive temperature rise of the substrate and the stage due to heat inputted from plasma. However, when the aforementioned groove is formed in the stage, the groove may be cooled by the base and deposits may be likely to be deposited in the groove.

Therefore, a technique capable of reducing the deposition of deposits in the groove is expected.

First Embodiment

[Configuration of Plasma Processing Apparatus]

Figure 1:
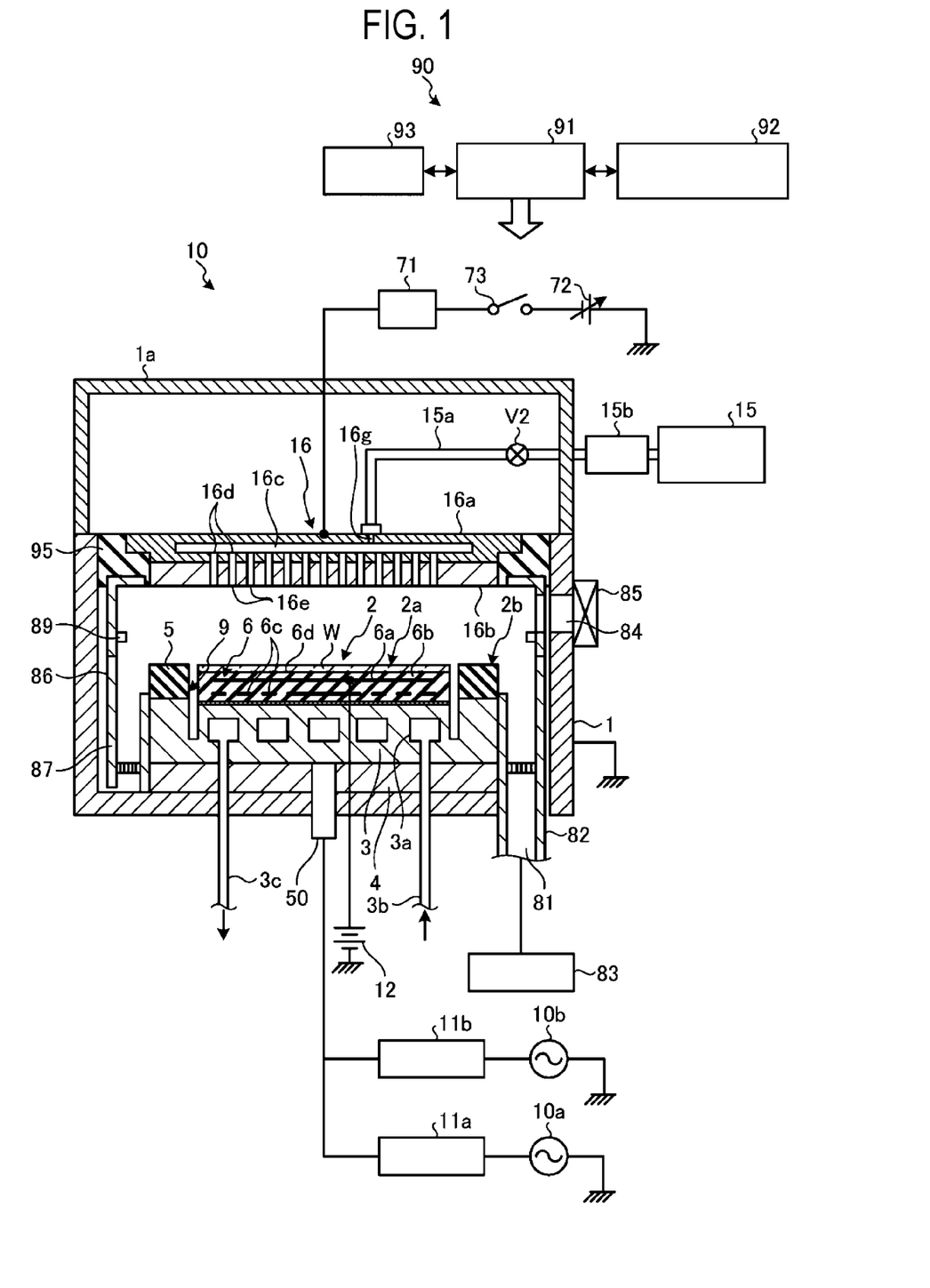
FIG. 1 is a schematic sectional view showing a schematic configuration of a plasma processing apparatus according to a first embodiment.

An embodiment will be described. First, a schematic configuration of a plasma processing apparatus 10 according to a first embodiment will be described. FIG. 1 is a schematic sectional view showing the schematic configuration of the plasma processing apparatus 10 according to the first embodiment.

The plasma processing apparatus 10 includes a processing container 1 having an airtight configuration and serving as an electrical ground potential. The processing container 1 has a cylindrical shape, and is made of, for example, aluminum or the like having an anodic oxide film formed on its surface. The processing container 1 defines a processing space in which plasma is generated. The processing container 1 accommodates a stage 2 that horizontally supports a substrate W such as a semiconductor wafer or the like which is a plasma processing target.

The stage 2 is formed in a substantially columnar shape facing the bottom surface in the vertical direction. The stage 2 includes a base 3 and an electrostatic chuck 6.

The stage 2 has a first region 2a on which the substrate W is placed and a second region 2b on which an edge ring 5 is placed. The first region 2a of the stage 2 is formed to be flat with substantially the same size as the substrate W. The electrostatic chuck 6 is arranged on and supported by an upper surface of the first region 2a of the stage 2. The second region 2b of the stage 2 is formed in an annular shape so as to surround the first region 2a. The edge ring 5 is arranged on and supported by an upper surface of the second region 2b of the stage 2. The edge ring 5 is an annular member arranged around the substrate W. Examples of the edge ring 5 may include a focus ring and an insulator ring. In the stage 2, the first region 2a and the second region 2b are divided by a groove 9 extending in an annular shape.

The base 3 is made of a conductive metal such as aluminum or the like. An anodic oxide film is formed on the surface of the base 3. The base 3 functions as a lower electrode. The base 3 is supported by a support 4 which is an insulator. The support 4 is installed at the bottom portion of the processing container 1.

An upper surface of the electrostatic chuck 6 has a flat disk shape, and serves as a placement surface 6d on which the substrate W is placed. The electrostatic chuck 6 includes an electrode 6a and an insulator 6b. The electrode 6a is provided inside the insulator 6b. A DC power supply 12 is connected to the electrode 6a. The electrostatic chuck 6 is configured to attract the substrate W by the Coulomb force when a DC voltage is applied to the electrode 6a from the DC power supply 12. Further, the electrostatic chuck 6 includes a heater 6c provided inside the insulator 6b. The heater 6c is supplied with electric power via a power feeding mechanism (not shown) to control the temperature of the substrate W.

The edge ring 5 is made of, for example, monocrystalline silicon. The edge ring 5 is placed in the second region 2b of the stage 2.

A power feeding rod 50 is connected to the base 3. A first RF power supply 10a is connected to the power feeding rod 50 via a first matcher 11a. Further, a second RF power supply 10b is connected to the power feeding rod 50 via a second matcher 11b. The first RF power supply 10a is a power supply for generating plasma. The base 3 is configured so that radio-frequency power of a predetermined frequency is supplied to the base 3 from the first RF power supply 10a. The second RF power supply 10b is a power supply for ion attraction (for bias). The base 3 is configured so that radio-frequency power of a predetermined frequency lower than that of the first RF power supply 10a is supplied from the second RF power supply 10b to the base 3 of the stage 2.

A flow path 3a through which refrigerant flows is formed inside the base 3. A refrigerant inlet pipe 3b is connected to one end of the flow path 3a, and a refrigerant outlet pipe 3c is connected to the other end of the flow path 3a. The flow path 3a is located below the substrate W and functions to absorb the heat of the substrate W.

The plasma processing apparatus 10 has a configuration in which the temperature of the stage 2 can be controlled by circulating the refrigerant, for example, cooling water or the like through the flow path 3a. The plasma processing apparatus 10 may have a configuration in which the temperature of the stage 2 can be controlled by supplying a cold heat transfer gas to the side of the back surface of the substrate W and the edge ring 5. For example, a gas supply pipe for supplying a cold heat transfer gas (backside gas) such as a helium gas or the like to the back surface of the substrate W may be provided so as to penetrate the stage 2 and the like. The gas supply pipe is connected to a gas source. With these configurations, the temperature of the substrate W attracted and held by the electrostatic chuck 6 on the upper surface of the stage 2 is controlled to a predetermined temperature.

On the other hand, a shower head 16 having a function as an upper electrode is provided above the stage 2 so as to face the stage 2 in parallel. The shower head 16 and the stage 2 function as a pair of electrodes (the upper electrode and the lower electrode).

The shower head 16 is provided at the top wall portion of the processing container 1. The shower head 16 includes a main body portion 16a and an upper top plate 16b that constitutes an electrode plate. The shower head 16 is supported on the upper portion of the processing container 1 via an insulating member 95. The main body portion 16a is made of a conductive material, for example, aluminum having an anodic oxide film formed on its surface. The main body portion 16a is configured so that the upper top plate 16b can be detachably supported at the lower portion thereof.

The main body portion 16a has a gas diffusion chamber 16c provided therein. A large number of gas flow holes 16d penetrating the gas diffusion chamber 16c are formed in a lower surface of the main body portion 16a. The upper top plate 16b has gas introduction holes 16e that are formed to penetrate the upper top plate 16b in the thickness direction and to overlap with the gas flow holes 16d. With such a configuration, a processing gas supplied to the gas diffusion chamber 16c is distributed and supplied in the form of a shower into the processing container 1 through the gas flow holes 16d and the gas introduction holes 16e.

The main body portion 16a has a gas introduction port 16g for introducing the processing gas into the gas diffusion chamber 16c. One end of the gas supply pipe 15a is connected to the gas introduction port 16g. A processing gas source 15 for supplying the processing gas is connected to the other end of the gas supply pipe 15a. A mass flow controller (MFC) 15b and an opening/closing valve V2 are provided in the gas supply pipe 15a sequentially from the upstream side. The processing gas source 15 supplies a processing gas for plasma etching to the gas supply pipe 15a. The processing gas is supplied to the gas diffusion chamber 16c via the gas supply pipe 15a. Then, the processing gas is distributed and supplied from the gas diffusion chamber 16c into the processing container 1 through the gas flow holes 16d and the gas introduction holes 16e in the form of a shower.

A variable DC power supply 72 is electrically connected to the shower head 16 as the upper electrode via a low-pass filter (LPF) 71. The variable DC power supply 72 is configured so that the power supply can be turned on and off by an on/off switch 73. The current/voltage of the variable DC power supply 72 and the on/off of the on/off switch 73 are controlled by a controller 90 to be described later. When radio frequency is applied to the stage 2 from the first RF power supply 10a and the second RF power supply 10b to generate plasma in the processing space, if necessary, the on/off switch 73 may be turned on by the controller 90 to apply a predetermined DC voltage to the shower head 16 as the upper electrode.

Further, a cylindrical ground conductor 1a is provided so as to extend above a height position of the shower head 16 from the side wall of the processing container 1. The cylindrical ground conductor 1a has a top wall at the upper portion thereof.

An exhaust port 81 is formed at the bottom portion of the processing container 1. An exhaust device 83 is connected to the exhaust port 81 via an exhaust pipe 82. The exhaust device 83 includes a vacuum pump. The exhaust device 83 is configured so that the inside of the processing container 1 can be depressurized to a predetermined degree of vacuum by operating the vacuum pump. Meanwhile, a loading/unloading port 84 for the substrate W is provided on the side wall of the processing container 1. A gate valve 85 that opens and closes the loading/unloading port 84 is provided in the loading/unloading port 84.

A deposit shield 86 is provided along an inner wall surface of the side portion of the processing container 1. The deposit shield 86 prevents etching by-products (deposits) from adhering to the processing container 1. At substantially the same height position as the substrate W on the deposit shield 86, a conductive member (GND block) 89 is connected so that the potential with respect to the ground can be controlled, whereby abnormal discharge is prevented. Further, a deposit shield 87 extending along the stage 2 is provided at a lower end portion of the deposit shield 86. The deposit shields 86 and 87 are configured to be attachable and detachable.

The operations of the plasma processing apparatus 10 having the above configuration are collectively controlled by the controller 90. A process controller 91 provided with a CPU and configured to control each part of the plasma processing apparatus 10, a user interface 92 and a memory part 93 are provided in the controller 90.

The user interface 92 includes a keyboard for a process manager to input commands for managing the plasma processing apparatus 10, a display for visualizing and displaying the operating status of the plasma processing apparatus 10, and the like.

The memory part 93 stores control programs (software) for realizing various processes executed by the plasma processing apparatus 10 under the control of the process controller 91, and recipes in which processing condition data and the like are stored. If necessary, an arbitrary recipe is called out from the memory part 93 in response to an instruction from the user interface 92 or the like and executed by the process controller 91, whereby a predetermined process is performed in the plasma processing apparatus 10 under the control of the process controller 91. Further, the control programs and the recipes such as processing condition data and the like may be stored in an external hard disk or semiconductor memory. In addition, the control programs and the recipes such as processing condition data and the like may be set at a predetermined position of the memory part 93 in a state in which they are accommodated in a portable non-transitory computer-readable storage medium such as a CD-ROM, a DVD or the like.

[Configuration of Stage 2]

Figure 2:
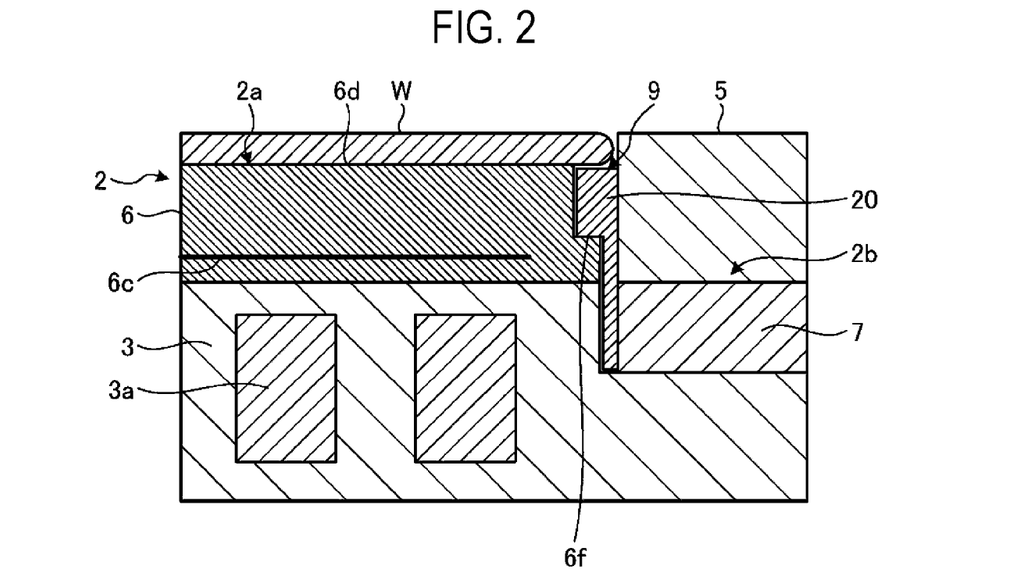
FIG. 2 is a schematic cross-sectional view showing a configuration of a main part of a stage according to the first embodiment.

Next, the configuration of the main part of the stage 2 according to the first embodiment will be described with reference to FIG. 2. FIG. 2 is a schematic sectional view showing the configuration of the main part of the stage 2 according to the first embodiment.

The stage 2 includes the base 3 and the electrostatic chuck 6. The stage 2 has the first region 2a on which the substrate W is placed and the second region 2b on which the edge ring 5 is placed. The electrostatic chuck 6 is arranged in the first region 2a on the base 3. The substrate W is placed on the electrostatic chuck 6.

The base 3 is provided with a pedestal 7 in the second region 2b. The pedestal 7 is formed in an annular shape by, for example, silicon, quartz, aluminum, or the like. The pedestal 7 is arranged so as to surround the first region 2a. An upper surface of the pedestal 7 is formed in a flat shape, and the edge ring 5 is placed on the upper surface. The pedestal 7 supports the edge ring 5. The stage 2 may be formed by the base 3 extending up to the portion of the pedestal 7 without providing the pedestal 7 separately from the base 3. That is, in the stage 2, the base 3 may function as the pedestal 7 that supports the edge ring 5.

In the base 3, a groove 9 is formed between the first region 2a and the second region 2b. The upper surface of the stage 2 is divided into the first region 2a and the second region 2b by the groove 9.

The base 3 is cooled by circulating refrigerant through the flow path 3a.

The electrostatic chuck 6 includes the heater 6c provided inside the insulator 6b. One heater 6c may be provided on the entire area of the placement surface 6d, or may be individually provided for each of the divided regions of the placement surface 6d. That is, a plurality of heaters 6c may be individually provided for the respective divided regions of the placement surface 6d.

The plasma processing apparatus 10 controls the temperature of the substrate W on the electrostatic chuck 6 to a predetermined temperature by supplying electric power to the heater 6c of the electrostatic chuck 6 and heating the substrate W while circulating the refrigerant through the flow path 3a to cool the base 3.

In the case where the groove 9 is provided in the stage 2, the groove 9 is cooled by the base 3, and deposits such as a polymer and the like are likely to be deposited in the groove 9.

Therefore, a shield that thermally separates the first region 2a and the second region 2b is provided in the groove 9 of the stage 2. In the first embodiment, a side surface protection member 20 that protects the side surfaces of the electrostatic chuck 6 and the base 3 facing the groove 9 is provided as a shield in the groove 9. The side surface protection member 20 mainly composed of a silicon-containing substance (e.g., Si, $SiO_2$ (quartz or the like), SiC). The side surface protection member 20 may be made of ceramic (e.g., $Al_2O_3$, AlN, $Y_2O_3$, etc.) or a metal such as aluminum, titanium or stainless steel whose surface is insulated (coated with an oxide film or an insulator).

The electrostatic chuck 6 has a larger outer diameter at the lower portion thereof than at the upper portion thereof. At a lower end of the electrostatic chuck 6, a flange portion 6f protruding radially outward of the electrostatic chuck 6 is formed.

The side surface protection member 20 is formed so as to cover the inner side surfaces of the electrostatic chuck 6 and the base 3 extending along the groove 9. The side surface protection member 20 has an inner diameter slightly larger than the diameter of the side surfaces of the electrostatic chuck 6 and the base 3 on the inner side of the groove 9. The side surface protection member 20 is formed such that the inner diameter of the upper portion thereof is smaller than that of the lower portion thereof. The side surface protection member 20 is held by engaging with the flange portion 6f of the electrostatic chuck 6.

[Operation and Effect]

Next, the operation and effect of the stage 2 according to the first embodiment will be described.

When plasma processing such as plasma etching is performed by the plasma processing apparatus 10, heat is inputted from the plasma into the substrate W and the edge ring 5, which are placed on the stage 2, and the side surface protection member 20. The temperature of the substrate W, the edge ring 5 and the side surface protection member 20 rises due to the heat inputted from the plasma. Further, when the temperature of the substrate W or the edge ring 5 rises, radiant heat is inputted into the side surface protection member 20 from the substrate W or the edge ring 5. In addition, when heating is performed by the heater 6c, heat is inputted to the side surface protection member 20 from the electrostatic chuck 6. As a result, the temperature of the side surface protection member 20 rises, thereby making it difficult for deposits to adhere to the side surface protection member 20.

Figure 3:
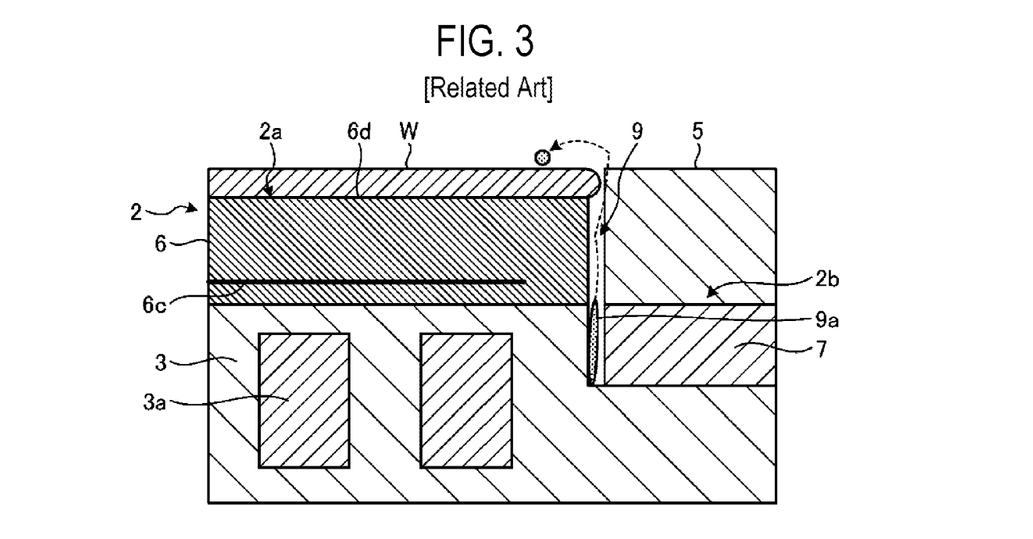
FIG. 3 is a schematic sectional view showing a configuration of a main part of a conventional stage.

As a comparative example, there is shown an example of the configuration of a conventional stage 2. FIG. 3 is a schematic sectional view showing a configuration of a main part of the conventional stage 2. The conventional stage 2 is configured to provide a groove 9 between a first region 2a on which the substrate W is placed and a second region 2b on which an edge ring 5 is placed, thereby increasing the temperature difference. In the conventional stage 2, the groove 9 is a space in which nothing is arranged. When the groove 9 is provided in the stage 2 in this way, the surface of the groove 9 is cooled by a base 3, whereby deposits 9a such as a polymer and the like are deposited in the groove 9. Such deposits 9a are disturbed and are lifted up due to a fluctuation in electric field or the like and become particles, which may cause defects. Conventionally, in the plasma processing apparatus 10, a method of removing deposits deposited on a structure around a substrate by cleaning using a plasma process has been mainly used. However, such a plasma-based cleaning not only removes deposits, but also may cause damage to normal parts due to plasma.

On the other hand, as shown in FIG. 2, the stage 2 according to the first embodiment is provided with the side surface protection member 20 in the groove 9. The side surface of the base 3 exposed by the groove 9 has the same temperature as the temperature of the refrigerant. In the stage 2 according to the first embodiment, the side surface of the base 3 is covered with the side surface protection member 20 having a higher temperature than the side surface of the base 3. That is, the side surface of the base 3 which is close to the substrate W and kept at a low temperature to allow easy deposition of deposits 9a until now, is covered with the side surface protection member 20, and instead, the side surface protection member 20 which has been warmed is exposed. Since the temperature of the side surface protection member 20 is higher than that of the exposed base 3, the deposition of deposits is suppressed as compared with the conventional case. As described above, the stage 2 according to the first embodiment can reduce the deposition of deposits in the groove 9 by providing the side surface protection member 20 in the groove 9. As a result, the plasma processing apparatus 10 according to the first embodiment can remove the deposits in the groove 9 by the plasma-based cleaning in a shorter time or at a weaker intensity than that in the conventional case, and can reduce damage to the parts due to plasma. Moreover, in the stage 2 according to the first embodiment, when deposits are deposited on the side surface protection member 20, the deposits can be removed by replacing the side surface protection member 20 with a new one.

Further, the side surface protection member 20 according to the first embodiment is formed to have an inner diameter slightly larger than the diameter of the side surfaces of the electrostatic chuck 6 and the base 3 inside the groove 9, and a slight gap is provided between the side surface protection member 20 and the side surfaces of the electrostatic chuck 6 and the base 3 inside the groove 9. Thus, the stage 2 according to the first embodiment can suppress heat transfer between the side surface protection member 20 and the base 3 as small as possible. As a result, the stage 2 according to the first embodiment can efficiently set the temperature of the side surface protection member 20 to a temperature higher than that of the base 3, and can reduce the deposition of deposits. In addition, since the gap is provided between the side surface protection member 20 and the electrostatic chuck 6 and the base 3, even if there is a difference in thermal expansion between the side surface protection member 20 and the electrostatic chuck 6 and the base 3, it is possible to suppress the occurrence of cracks or the like in the side surface protection member 20.

As described above, the stage 2 according to the first embodiment includes the electrostatic chuck 6, the base 3 and the shield (side surface protection member 20). The electrostatic chuck 6 attracts and holds the substrate W. In the base 3, the first region 2a that supports the electrostatic chuck 6 and the second region 2b that supports the edge ring 5 arranged around the substrate W are divided by the groove 9 extending in an annular shape. The shield is provided in the groove 9 to thermally separate the first region 2a and the second region 2b. As a result, the stage 2 can reduce the deposition of deposits in the groove 9.

Further, the base 3 is provided with the flow path 3a through which the refrigerant flows. As a result, the stage 2 can control the temperature of the substrate W by allowing the refrigerant to flow through the flow path 3a and cooling the base 3.

Further, the stage 2 is provided with the heater 6c in the first region 2a. As a result, the stage 2 can control the temperature of the substrate W by heating the substrate W with the heater 6c.

Further, the shield (side surface protection member 20) is formed in a cylindrical shape to protect the side surfaces of the electrostatic chuck 6 and the base 3 facing the groove 9. As a result, the stage 2 can reduce the deposition of deposits on the side surfaces of the electrostatic chuck 6 and the base 3 facing the groove 9.

Second Embodiment

Next, a second embodiment will be described. Since a plasma processing apparatus 10 according to the second embodiment has the same configuration as the plasma processing apparatus 10 according to the first embodiment shown in FIG. 1, the description thereof will be omitted.

Figure 4:
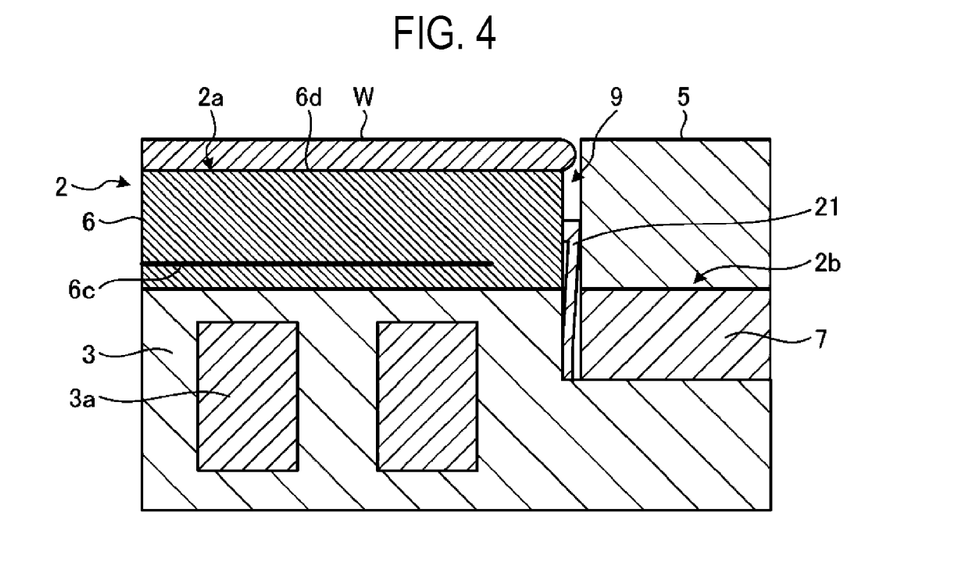
FIG. 4 is a schematic sectional view showing a configuration of a main part of a stage according to a second embodiment.

FIG. 4 is a schematic sectional view showing a configuration of a main part of a stage 2 according to the second embodiment. Since the stage 2 according to the second embodiment has partially the same configuration as the stage 2 according to the first embodiment shown in FIG. 2, the same parts are designated by like reference numerals and the description thereof will be omitted. Different parts will be mainly described.

The stage 2 according to the second embodiment is provided with an elastic member 21 as a shield in the groove 9. Examples of the elastic member 21 include rubber and the like. The elastic member 21 is elongated in a band shape and is formed in an annular shape. The elastic member 21 is attached to the stage 2 along the groove 9. In the stage 2 according to the second embodiment, the side surfaces of the electrostatic chuck 6 and the base 3 are tightened so as to be covered with the elastic member 21.

In the case in which the side surface of the base 3 is covered with such a band-shaped elastic member 21, the elastic member 21 has a large contact area with the base 3 having a low temperature, and the temperature tends to decrease.

Therefore, the stage 2 according to the second embodiment has a shape in which the contact area with the base 3 having a low temperature is reduced.

Figure 5A:
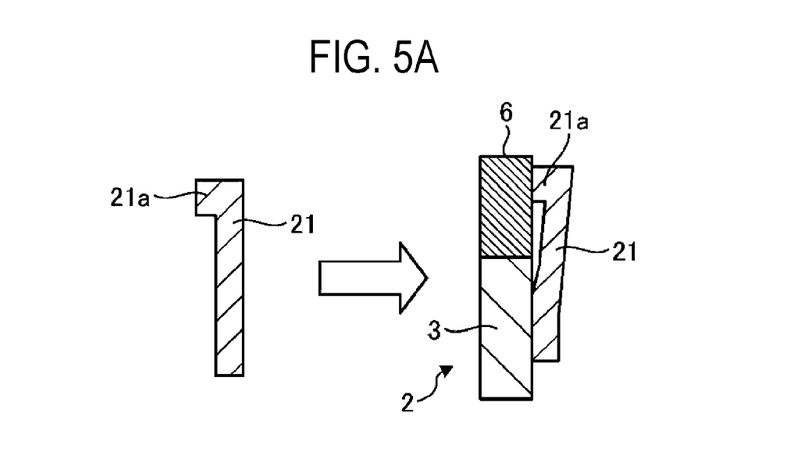
FIG. 5A is a diagram showing an example of a cross-sectional shape of an elastic member according to the second embodiment.

FIG. 5A is a diagram showing an example of the cross-sectional shape of the elastic member 21 according to the second embodiment. The cross-sectional shape of the elastic member 21 is shown on the left side in FIG. 5A. The elastic member 21 has a cross-sectional shape in which a protrusion 21a projecting inward is provided at the upper portion thereof. The elastic member 21 is formed to have an inner diameter which is approximately the same as the diameter of the groove 9 or slightly smaller than the diameter of the groove 9. For example, the elastic member 21 is formed to have an inner diameter smaller than the diameter of the groove 9 by a predetermined amount (e.g., several cm). On the right side in FIG. 5A, there is shown a state in which the elastic member 21 is attached to the stage 2. For example, the shape of the elastic member 21 is stretched such that the elastic member 21 is attached to the stage 2 along the groove 9. When the elastic member 21 shown in FIG. 5A is attached to the stage 2, the electrostatic chuck 6 can be tightened because the protrusion 21a is provided on the upper side making contact with the electrostatic chuck 6. Further, since the inner diameter of the elastic member 21 on the lower side coming into contact with the base 3 is larger than a position of the protrusion 21a, the restoring force of the rubber causes the lower end of the elastic member 21 to come into contact with the base 3, and a non-contact region that does not make contact with the base 3 is generated on the lower side of the protrusion 21a. As a result, the elastic member 21 can reduce the contact area with the base 3. That is, since the elastic member 21 shown in FIG. 5A has a small contact area with the base 3 and a large contact heat resistance with the base 3, it is less likely to be affected by the temperature of the base 3.

Figure 5B:
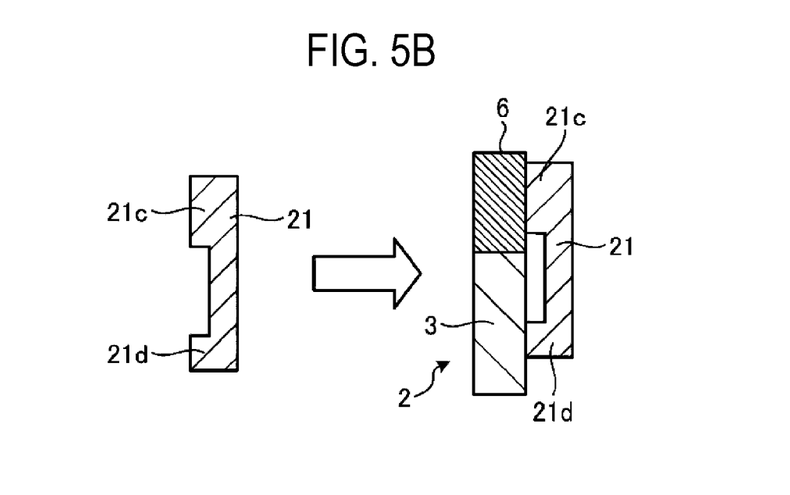
FIG. 5B is a diagram showing another example of the cross-sectional shape of the elastic member according to the second embodiment.

FIG. 5B is a diagram showing another example of the cross-sectional shape of the elastic member 21 according to the second embodiment. The cross-sectional shape of the elastic member 21 is shown on the left side in FIG. 5B. The elastic member 21 has a cross-sectional shape in which upper and lower protrusions 21c and 21d projecting inward are provided at both upper and lower ends, respectively. The lower protrusion 21d is formed to have a smaller width in the vertical direction than the upper protrusion 21c. The elastic member 21 is formed to have an inner diameter which is approximately the same as the diameter of the groove 9 or slightly smaller than the diameter of the groove 9. For example, the elastic member 21 is formed to have an inner diameter smaller than the diameter of the groove 9 by a predetermined amount (e.g., several cm). On the right side in FIG. 5B, there is shown a state in which the elastic member 21 is attached to the stage 2. For example, the shape of the elastic member 21 is stretched such that the elastic member 21 is attached to the stage 2 along the groove 9. When the elastic member 21 shown in FIG. 5B is attached to the stage 2, the electrostatic chuck 6 and the base 3 can be tightened at both the upper and lower ends thereof because the upper and lower protrusions 21c and 21d are provided at both upper and lower ends. Further, since the elastic member 21 has a wide inner diameter at the intermediate portion between the upper and lower protrusions 21c and 21d, a non-contact region that does not make contact with the base 3 is created in the intermediate portion. Moreover, in the elastic member 21, the lower protrusion 21d that comes into contact with the base 3 is formed to be smaller than the upper protrusion 21c. As a result, the elastic member 21 can reduce the contact area with the base 3. That is, since the elastic member 21 shown in FIG. 5B has a small contact area with the base 3 and a large contact heat resistance with the base 3, it is less likely to be affected by the temperature of the base 3.

The elastic member 21 grows hot by receiving heat from a peripheral structure whose temperature is kept high due to the heat inputted from the electrostatic chuck 6 or plasma. Although the elastic member 21 also comes into contact with the base 3 having a low temperature, the contact area with the base 3 can be reduced by providing the protrusions 21a, 21c and 21d. As a result, the temperature of the elastic member 21 rises, the adhesion of deposits is suppressed, and the deposition of deposits in the groove 9 can be reduced. Further, in the stage 2 according to the second embodiment, when deposits are deposited on the elastic member 21, the deposits can be removed by replacing the elastic member 21 with a new one.

As described above, in the stage 2 according to the second embodiment, the shield is the elastic member 21 formed in an annular shape to protect the side surfaces of the electrostatic chuck 6 and the base 3 facing the groove 9. As a result, the stage 2 can reduce the deposition of deposits on the side surfaces of the electrostatic chuck 6 and the base 3 facing the groove 9.

Further, the elastic member 21 has the first protrusion (protrusion 21a or 21c) protruding inward in an annular shape and comes into contact with the electrostatic chuck 6 at the first protrusion. Further, the elastic member 21 has the second protrusion (lower protrusion 21d) protruding inward in an annular shape and comes into contact with the base 3 at the second protrusion. Moreover, the elastic member 21 is formed so that the width of the second protrusion (lower protrusion 21d) in the vertical direction is smaller than that of the first protrusion (upper protrusion 21c). As a result, the elastic member 21 can reduce the contact area with the base 3, and can be less affected by the temperature of the base 3.

Third Embodiment

Next, a third embodiment will be described. Since a plasma processing apparatus 10 according to the third embodiment has the same configuration as the plasma processing apparatus 10 according to the first embodiment shown in FIG. 1, the description thereof will be omitted.

Figure 6:
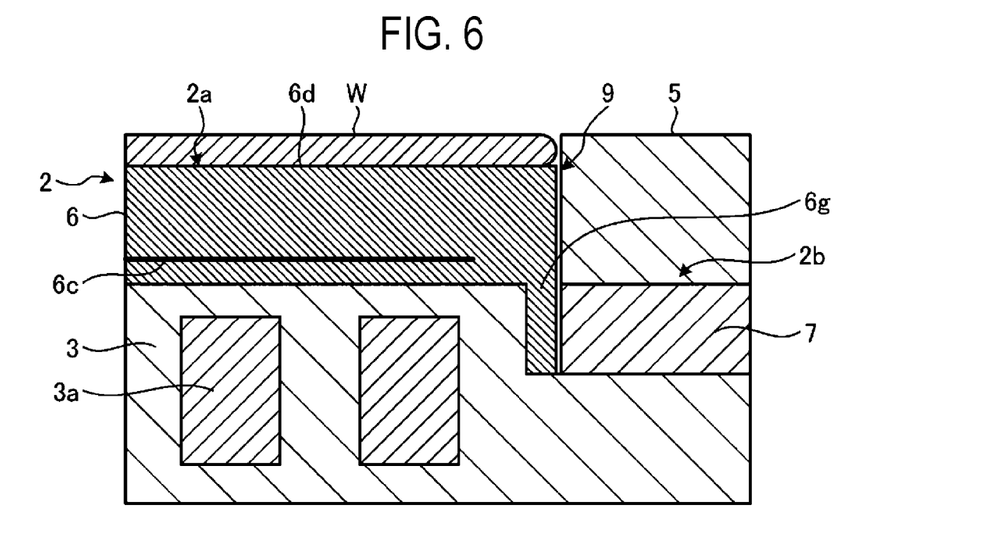
FIG. 6 is a schematic sectional view showing a configuration of a main part of a stage according to a third embodiment.

FIG. 6 is a schematic sectional view showing a configuration of a main part of a stage 2 according to the third embodiment. Since the stage 2 according to the third embodiment has partially the same configuration as the stages 2 according to the first and second embodiments shown in FIGS. 2 and 4, the same parts are designated by like reference numerals and the description thereof will be omitted. Different parts will be mainly described.

In the stage 2 according to the third embodiment, the outer peripheral portion of the electrostatic chuck 6 extends to the lower portion of the groove 9 so as to cover the side surface of the base 3. In the stage 2 according to the third embodiment, an extended portion 6g obtained by extending the outer peripheral portion of the electrostatic chuck 6 to the side surface of the base 3 is provided as a shield in the groove 9. Since the electrostatic chuck 6 is heated by the heater 6c, the temperature of the outer peripheral portion of the electrostatic chuck 6 is difficult to drop. The side surface of the base 3 is covered with the extended portion 6g so that the side surface thereof is not exposed. This makes it possible to reduce the deposition of deposits in the groove 9. An O-ring or the like may be arranged on the lower surface of the extended portion 6g to seal a gap between the extended portion 6g and the base 3. As a result, it is possible to suppress the deposition of deposits in the gap between the extended portion 6g and the base 3.

Figure 7:
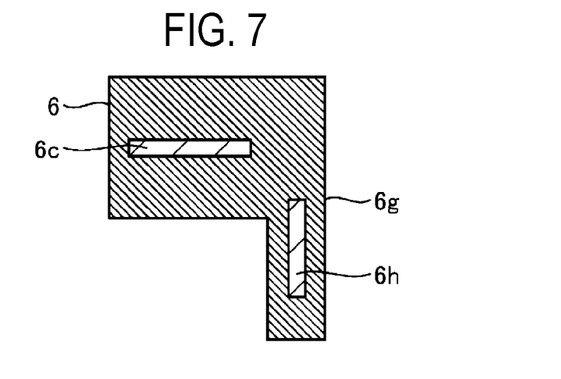
FIG. 7 is a diagram showing an example of a cross-sectional shape of an electrostatic chuck according to the third embodiment.

The electrostatic chuck 6 may be provided with a heater in the extended portion 6g extending to the side surface of the base 3. FIG. 7 is a diagram showing an example of the cross-sectional shape of the electrostatic chuck 6 according to the third embodiment. The electrostatic chuck 6 is provided with a heater 6h on the extended portion 6g obtained by extending the outer peripheral portion of the electrostatic chuck 6 to the side surface of the base 3. Electric power is individually supplied to the heater 6h from the DC power supply 12 or a DC power supply (not shown). As a result, in the electrostatic chuck 6, the temperature of the extended portion 6g corresponding to the side surface of the base 3 rises to suppress the adhesion of deposits, which makes it possible to reduce the deposition of deposits in the groove 9.

As described above, in the stage 2 according to the third embodiment, the shield (extended portion 6g) is formed by extending the electrostatic chuck 6 to the side surface of the base 3 in the groove 9. As a result, the stage 2 can reduce the deposition of deposits on the side surface of the base 3 facing the groove 9.

Further, the shield (extended portion 6g) is provided with the heater 6h in the extended portion extended to the side surface of the base 3 in the groove 9. As a result, the elastic member 21 can reduce the contact area with the base 3, and can be less affected by the temperature of the base 3.

Although the embodiments have been described above, the embodiments disclosed herein should be considered to be exemplary in all respects and not restrictive. Indeed, the above-described embodiments can be embodied in a variety of forms. Moreover, the above-described embodiment may be omitted, replaced or changed in various forms without departing from the scope of the claims and the gist thereof.

For example, in each of the above-described embodiments, the surface color of the side surface protection member 20, the elastic member 21 and the extended portion 6g may be black so that the radiant heat from the edge ring 5 can be easily absorbed.

Further, in each of the above embodiments, there has been described, by way of example, the case where the temperature of the edge ring 5 rises due to heat inputted from plasma and the radiant heat from the edge ring 5 enters the side surface protection member 20, the elastic member 21 and the extended portion 6g. However, the disclosed technique is not limited thereto. A contact portion that comes into contact with the edge ring 5 may be provided on some or all of the side surface protection member 20, the elastic member 21 and the extended portion 6g in the circumferential direction, and the heat may be transferred from the edge ring 5 through the contact portion to raise the temperature. For example, in the side surface protection member 20, the elastic member 21 and the extended portion 6g, contact portions that make contact with the edge ring 5 may be provided at predetermined angles (e.g., 30 degrees) in a spaced-apart relationship with each other in the circumferential direction, so that the heat is transferred from the edge ring 5.

Further, in each of the above-described embodiments, there has been described, by way of example, the case where the electrostatic chuck 6 is provided with the heater 6c. However, the disclosed technique is not limited thereto. The electrostatic chuck 6 may not be provided with the heater 6c.

It should be noted that the embodiments disclosed herein are exemplary in all respects and are not restrictive. Indeed, the above-described embodiments can be embodied in a variety of forms. Moreover, the above-described embodiments may be omitted, replaced or modified in various forms without departing from the scope and spirit of the appended claims.

According to the present disclosure in some embodiments, it is possible to reduce deposition of deposits in a groove.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A stage for mounting a substrate thereon, the stage comprising:
    an electrostatic chuck configured to attract the substrate;
    a base having a first region on which the electrostatic chuck is supported and a second region on which an edge ring arranged around the substrate is supported, the first region and the second region being divided by a groove extending in an annular shape;
    a shield provided in the groove and configured to thermally separate the first region and the second region, and
    an annular pedestal disposed in the second region and supporting the edge ring thereon,
    wherein the shield is an elastic member formed in an annular shape and is configured to protect side surfaces of the electrostatic chuck and the base facing the groove,
    wherein the elastic member includes a first contact contacting the electrostatic chuck without contacting the base, and includes a second contact contacting the base without contacting the electrostatic chuck, the first contact and the second contact being separated from each other in a vertical direction,
    wherein the first contact includes a first protrusion protruding inward in an annular shape which contacts the electrostatic chuck,
    wherein the second contact includes a second protrusion protruding inward in an annular shape which contacts the base, and wherein the groove is formed between the electrostatic chuck and the edge ring and between the base and the annular pedestal,
    wherein the elastic member does not contact an interface between the electrostatic chuck and the base.

2. The stage of claim 1, wherein the base is provided with a flow path through which a refrigerant flows.

3. The stage of claim 2, wherein a heater is provided in the first region.

4. The stage of claim 1, wherein the elastic member is formed such that the second protrusion has a smaller width in a vertical direction than that of the first protrusion.

5. A plasma processing apparatus, comprising:
    a stage for mounting a substrate thereon, the stage further comprising:
    an electrostatic chuck configured to attract the substrate;
    a base having a first region on which the electrostatic chuck is supported and a second region on which an edge ring arranged around the substrate is supported, the first region and the second region being divided by a groove extending in an annular shape;

a shield provided in the groove and configured to thermally separate the first region and the second region, and an annular pedestal disposed in the second region and supporting the edge ring thereon, wherein the shield is an elastic member formed in an annular shape and is configured to protect side surfaces of the electrostatic chuck and the base facing the groove, and wherein the elastic member includes a first contact contacting the electrostatic chuck without contacting the base, and includes a second contact contacting the base without contacting the electrostatic chuck, the first contact and the second contact being separated from each other in a vertical direction, wherein the first contact includes a first protrusion protruding inward in an annular shape which contacts the electrostatic chuck, wherein the second contact includes a second protrusion protruding inward in an annular shape which contacts the base, and wherein the groove is formed between the electrostatic chuck and the edge ring and between the base and the annular pedestal, wherein the elastic member does not contact an interface between the electrostatic chuck and the base.

* * * * *